United States Patent [19]

Moore et al.

[11] Patent Number: 4,777,616

[45] Date of Patent: Oct. 11, 1988

[54] INCREASED RESOLUTION LOGIC ANALYZER USING ASYNCHRONOUS SAMPLING

[75] Inventors: B. J. Moore; William E. Shoemaker, both of Monte Sereno, Calif.

[73] Assignee: Outlook Technology, Inc., Saratoga, Calif.

[21] Appl. No.: 862,281

[22] Filed: May 12, 1986

[51] Int. Cl.[4] ........................ G06F 11/00; G01R 31/28

[52] U.S. Cl. .................................. 364/900; 324/73 R; 371/15

[58] Field of Search ... 364/200 MS File, 900 MS File, 364/481, 487, 580, 483, 486; 371/15, 16, 18, 20; 324/73 R, 73 AT

[56] References Cited

U.S. PATENT DOCUMENTS

| | | | |
|---|---|---|---|
| 4,425,643 | 1/1984 | Chapman et al. | 371/20 |
| 4,445,192 | 4/1984 | Haag et al. | 364/900 |
| 4,507,740 | 3/1985 | Star et al. | 364/487 |
| 4,516,119 | 5/1985 | Fukuta | 340/728 X |
| 4,525,667 | 6/1985 | Sawano et al. | 324/73 R X |
| 4,558,422 | 12/1985 | Denbeste et al. | 364/480 |
| 4,673,931 | 6/1987 | Cunningham | 340/722 |
| 4,697,138 | 9/1987 | Morishita et al. | 324/73 R |
| 4,701,918 | 10/1987 | Nakajima et al. | 371/27 X |

OTHER PUBLICATIONS

"Time Interval Averaging", Hewlett-Packard Application Note 162-1, published before May 12, 1986, pp. 1-15.

*Primary Examiner*—Raulfe B. Zache
*Assistant Examiner*—Florin Munteanu
*Attorney, Agent, or Firm*—Majestic, Gallagher, Parsons & Siebert

[57] ABSTRACT

Techniques for a logic analyzer instrument that permit the acquisition of digital samples from a plurality of logic signals in a large mainframe computer, or other system under test, in a manner that the signals can be reconstructed for viewing and analysis of the relationship between them. Edges of the signals are located, during their reconstruction, with many times higher resolution than that of the sampling clock. A plurality of sample records, asynchronously timed, are taken of the logic signals from the system under test, and the samples are combined in a way that locates logic signal edges with precision.

13 Claims, 6 Drawing Sheets

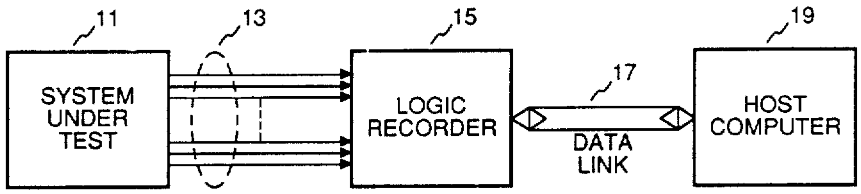
FIGURE 1
| | INTERVAL NO. | | | | |
|---|---|---|---|---|---|
| | −2 | −1 | 0 | +1 | +2 |
| BY SAMPLING SIGNAL NO. 1: | 0 | 1 | 0 | 1 | 1 |
| " " " " 2: | 0 | 0 | 0 | 0 | 1 |
| " " " " 3: | 0 | 1 | 0 | 1 | 1 |
| " " " " 4: | 0 | 0 | 0 | 0 | 1 |
| " " " " 5: | 0 | 0 | 0 | 0 | 1 |
| TOTAL 1s: | 0 | 2 | 0 | 2 | 5 |
FIGURE 7.
SIGNAL VALUES SAMPLED FROM ACTUAL SIGNAL NO. 2 OF FIGURE 2(C).
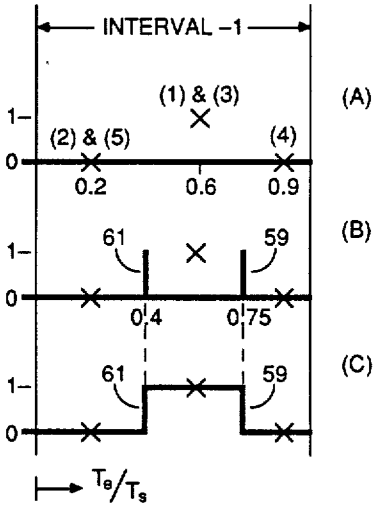
FIGURE 8.
RECONSTRUCTING SIGNAL NO. 2 FROM ITS SAMPLES

| | INTERVAL NO. -2 | -1 | 0 | +1 | +2 |
|---|---|---|---|---|---|
| BY SAMPLING SIGNAL NO. 1: | 1 | 0 | 0 | 0 | 1 |
| " " " " 2: | 1 | 1 | 0 | 0 | 1 |
| " " " " 3: | 1 | 0 | 0 | 0 | 1 |
| " " " " 4: | 1 | 0 | 0 | 1 | 1 |
| " " " " 5: | 1 | 1 | 0 | 0 | 1 |
| TOTAL 1s: | 5 | 2 | 0 | 1 | 5 |

*FIGURE 5.*
*SIGNAL VALUES SAMPLED FROM ACTUAL SIGNAL NO. 1 OF FIGURE 2(B)*

| 35 INTERVAL NO. | 37 TOTAL PROPORTION OF 1s | 39 IF A SAMPLE IS 0, $T_e/T_s$ OF THE SAMPLING SIGNAL LIES BETWEEN: | | 41 IF A SAMPLE IS 1, $T_e/T_s$ OF THE SAMPLING SIGNAL LIES BETWEEN: | | 43 SAMPLES ACQUIRED BY SAMPLING SIGNAL NO. 1 | | 45 SAMPLES ACQUIRED BY SAMPLING SIGNAL NO. 2 | | 47 SAMPLES ACQUIRED BY SAMPLING SIGNAL NO. 3 | | 49 SAMPLES ACQUIRED BY SAMPLING SIGNAL NO. 4 | | 51 SAMPLES ACQUIRED BY SAMPLING SIGNAL NO. 5 | |
|---|---|---|---|---|---|---|---|---|---|---|---|---|---|---|---|
| | | > | < | > | < | > | < | > | < | > | < | > | < | > | < |
| -2 | 1.0 | — | — | 0 | 1.0 | 0 | 1.0 | 0 | 1.0 | 0 | 1.0 | 0 | 1.0 | 0 | 1.0 |
| -1 | 0.4 | 0.4 | 1.0 | 0 | 0.4 | 0.4 | 1.0 | 0 | 0.4 | 0.4 | 1.0 | 0.4 | 1.0 | 0 | 0.4 |
| 0 | 0 | 0 | 1.0 | — | — | 0 | 1.0 | 0 | 1.0 | 0 | 1.0 | 0 | 1.0 | 0 | 1.0 |
| +1 | 0.2 | 0 | 0.8 | 0.8 | 1.0 | 0 | 0.8 | 0 | 0.8 | 0 | 0.8 | 0.8 | 1.0 | 0 | 0.8 |
| +2 | 1.0 | — | — | 0 | 1.0 | 0 | 1.0 | 0 | 1.0 | 0 | 1.0 | 0 | 1.0 | 0 | 1.0 |
| | | | | RANGE: | | 0.4 → 0.8 | | 0 → 0.4 | | 0.4 → 0.8 | | 0.8 → 1.0 | | 0 → 0.4 | |
| | | | | $T_e/T_s$: | | 0.6 | | 0.2 | | 0.6 | | 0.9 | | 0.2 | |

*FIGURE 6.*
*DETERMINING $T_e/T_s$ FOR EACH SAMPLING SIGNAL FROM SAMPLED DATA FROM ACTUAL SIGNAL NO. 1 (FIGURE 2(B))*

INCREASED RESOLUTION LOGIC ANALYZER USING ASYNCHRONOUS SAMPLING

BACKGROUND OF THE INVENTION

This invention relates generally to digital signal sampling techniques, and more specifically to such techniques as implemented in logic analyzers and other test equipment.

Logic analyzer instruments are widely used to test and analyze the operation of digital circuitry by simultaneously acquiring a large number of samples of logic signals at different points within the digital circuitry. An example of such digital circuitry is a portion of a mainframe computer. The logic analyzer instrument has a number of conductors, such as from 4 to 50, which are provided at their ends with individual connectors or probes for attachment to different circuit points within the digital system being tested. Each logic signal has only high or low voltage levels. All logic signals being recorded by the logic analyzer are periodically and simultaneously sampled by the logic analyzer to determine whether they are high or low at each sample time. This information is stored in a digital memory and used to reconstruct the waveforms, which are then displayed for analysis by the technologist who is conducting the test.

A primary purpose of such a test is to determine the relative time relationship of logic signals at the different circuit points to which the logic analyzer is connected within the system or device under test. That is, it is the relative times of the transition of the various logic signals between their high and low states that is analyzed. The determination of the interval between the time that certain of these acquired logic signals change state is useful in testing or evaluating digital hardware parameters, such as propagation delay, channel-to-channel-skew, setup time, and hold time. Another use for a logic analyzer is to record the states of various logic signals when they are known to be stable. Such logic state relationships, usually representing addresses or data words, are important in software analysis.

In any application, the logic analyzer has a finite memory which continually records samples of the logic signals being acquired until a triggering event occurs. Such a triggering event can be set to occur in response to a particular combination of the logic signals, some arbitrary time or event, and the like.

Present logic analyzers develop a sampling clock signal in one of two distinct ways. One way is simply to connect the instrument to the internal clock of the system under test, either by a direct connection or by deriving the clock from the acquired signals being analyzed. The logic signals are then sampled at a rate equal to the clock frequency of the system under test. The other way is to generate the clock signal within the instrument that is independent of and asynchronous to the logic signals of the system under test. In either case, the instrument can only determine for each logic signal acquired that a signal level has changed in an interval between two consecutive samples. The higher frequencies now used in computer system clocks, and the current use of multiple phase clocks, require increased sampling rates in order to improve the resolution of the acquired information. The asynchronous technique has been utilized by increasing the frequency of the instrument's internal clock. This approach is, however, reaching the limit of the instrument's circuit speed, and is quite costly to implement.

Therefore, it is a primary object of the present invention to further increase the resolution of existing logic analyzer instruments.

SUMMARY OF THE INVENTION

This and additional objects are accomplished by the various aspects of the present invention, wherein, briefly, a multitude of recordings of given logic signals in the system under test are made at a stable asynchronous sample clock rate, and recordings are stored in a memory. The location in time of transitions (edges) of the acquired logic signals are then determined by analyzing the stored recordings. The signals are reconstructed from that analyzed data. The signal edges are located by such processing to within a small fraction of a period of the sample clock, thereby increasing the resolution of the instrument without using a brute force technique of increasing an instrument's internal asynchronous sample clock rate. Even if such an increase is possible, given limitations present in the design of existing instruments, it can be accomplished only at the expense of substituting faster circuits and components. An advantage of the processing techniques of the present invention is that existing, relatively slow logic analyzer instruments, and other types of test equipment, can be reprogrammed to acquire and process data in accordance with the present invention, thereby to substantially increase their signal resolution capabilities with little or no hardware changes being necessary.

According to one specific aspect of the present invention, edges of logic signals having no more than one edge in a period of the sample clock are precisely located from the recorded data by calculating the relative number of high state and low state data samples asynchronously obtained in a defined interval of time in which the transition occurs. The signal edge is then calculated to be located a distance from one end of the interval that is proportional to this relative number.

According to another specific aspect of the present invention, logic signals having more than one edge within the course of one clock period can also be reconstructed with precision from the recorded data by determining the relative time relationships of the data records. This is accomplished by comparing individual records of data with the total amount of data. Once the time relationships of the many data points recorded for each interval of the signals are determined, the individual signals are reconstructed with a high resolution by the use of each data point. This ability permits the precise reconstruction of short pulses that indicate a problem with the circuit under test but which are seldom discovered by existing techniques, and certainly not reconstructed with great accuracy.

Additional objects, features and advantages of the various aspects of the present invention will become apparent from the following description of a preferred embodiment thereof, which description should be taken in conjunction with the accompanying drawings.

BRIEF DESCRIPTION OF THE DRAWINGS

FIG. 1 illustrates, in block diagram form, a logic analyzer and an example of its use;

FIG. 5 is data acquired from one of the example signals of FIG. 2;

FIG. 6 shows processing of the data of FIG. 5;

FIG. 7 is data acquired from another of the example signals of FIG. 2;

FIGS. 8(A) through 8(C) show processing of the data of FIG. 7; and

DESCRIPTION OF A PREFERRED EMBODIMENT

Figure 2:
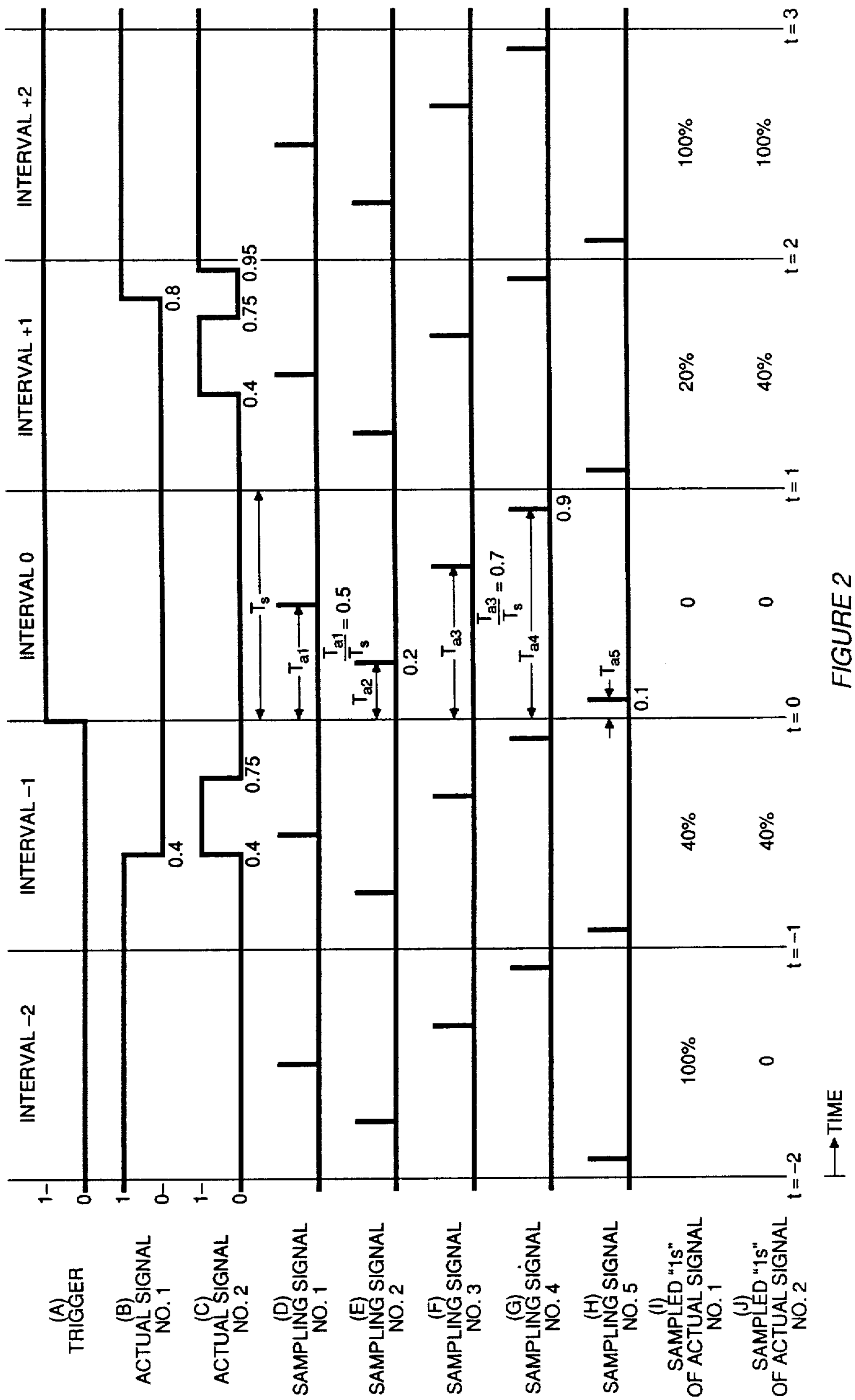
FIGS. 2(A) through 2(J) show an example of signal samples being acquired according to the present invention by a logic analyzer being used as shown in FIG. 1.

Referring to FIG. 1, a system under test 11 is any digital system or device whose logic signals are desired to be observed and/or recorded. An example of such a system is a large mainframe computer. A plurality of conductors 13 are connected between various circuit points of the system 11 and a logic recorder 15. Each of the conductors 13 is connected to a different circuit node of the system 11 and thus acquires a separate logic signal for analysis by the logic recorder 15. The logic recorder 15 periodically samples each of the signals in the conductors 13 simultaneously, and then stores those samples for later use in displaying and analyzing their relative timing. The logic recorder 15 embodying the various aspects of the present invention is described hreinafter with respect to FIGS. 2-9.

Most current logic analyzers are sold in the form of complete instruments, including keyboard inputs, cathode ray tube displays, and similar basic components. But the trend is to separate such instrumentation into two pieces. A first piece includes the circuits and systems that are peculiar to the specific testing function being performed. A second item is a general piece of equipment, such as a general purpose microcomputer, which can serve to perform basic control and processing functions. Accordingly, in FIG. 1, the logic recorder circuits 15 are those that are specific to the logic analyzer functions being performed, while those circuits are connected through a data link 17 to a general purpose computer 19. The computer 19 runs basic control and implementation software. The techniques of the present invention are involved in both the logic recorder 15 and computer 19 portions of the system. The aspects of the present invention described below can also be implemented in a stand alone logic analyzer that includes a built-in keyboard, CRT display, and so forth, as well as the divided system illustrated in FIG. 1.

Referring to FIG. 2, waveforms of two actual signals are given as examples, as well as sampling waveforms, which are frequently referenced in the following discussion. The waveforms, data and processes illustrated with respect to FIGS. 3-8 refer back to the example waveforms and sampling patterns chosen for illustration in FIG. 2.

FIG. 2(B) shows one illustrative logic signal in the system under test 11, and FIG. 2(C) another. FIG. 2(A) shows a trigger signal that changes state at time $t=0$. This is a trigger event to which other events are referenced in time, and, as is well known, can be derived from a single signal, as shown in FIG. 2(A), or from a combination of signals, or some other source. The purpose of the trigger in logic analyzers is to stop recording at a time related to the trigger event so that the signals of the system under test 11 are stored for a time period where something is suspected to be occurring that is desired to be analyzed. In this example, the trigger event is assumed to cause capture of samples of the logic signals being acquired for a time before and after the trigger event. Of course, as is well known, the samples actually acquired can alternatively be exclusively from a time before, or exclusively from a time after the trigger event.

Each of FIGS. 2(D) through 2(H) show a separate sampling signal. Although sampling signal is generally a leading edge of a clock pulse, only a single vertical line is shown in FIGS. 2(D)-2(H) for simplicity. Each of these five sampling signals has the same constant repetition rate; that is, the time between sampling pulses is a constant, and is the same for each of the sampling signals. What is different between them is their time of occurrence, as is apparent from FIG. 2. Each of the five sampling signals is asynchronous to the trigger and actual signals of FIGS. 2(A) through 2(C). It is assumed, as is the case in circuits being so analyzed, that the actual signals and trigger repeatedly occur, so that at one occurrence samples of the signals of FIGS. 2(B) and 2(C) are acquired by the sampling signal of FIG. 2(D). In another occurrence of those signals, samples are acquired by the sampling signal of FIG. 2(E), and so forth. By not synchronizing the sampling signals with the actual signals from which samples are being acquired, the samples are randomly, or pseudo-randomly, distributed in time. The usefulness of this aspect of asynchronous sampling will become apparent as the description proceeds.

The following description requires conceptually defining a plurality of time intervals shown in FIG. 2. The trigger event is shown to occur at time $t=0$. Time intervals are then defined to extend in both directions from that reference point, each interval having the same time duration, which is made equal to the repetition period of the sampling signals of FIG. 2(D) through 2(H). The duration of each such interval is defined as Ts. There is one sample of each of the sampling signals of FIGS. 2(D) through 2(H) that occurs in each interval. The relative position of that sample to the interval boundaries is important, that being indicated by the quantity Ta1 of the sampling signal of FIG. 2(D). Each sample of that signal will be positioned at the same location within its respective interval. For the sampling signal of FIG. 2(D), this position is midway in the interval. For the sampling signal of FIG. 2(E), displacement Ta2 is two-tenths of the distance across the interval, measured from the left edge of that interval. Of course, when the data is first processed, the relative time relationships of the sampling signals is unknown, and is one of the quantities that is determined in implementing one aspect of the present invention.

Nor are the locations of the transitions in the actual signals of FIGS. 2(B) and 2(C) known. These are the quantities that are desired to be determined, but locations of the edges within the defined intervals are illustrated in FIGS. 2(B) and (C). FIG. 2(B) shows a signal of one type that has only one transition in each interval. The actual logic signal of FIG. 2(C) illustrates another type, one which has two or more transitions in at least one interval. It is particularly this latter type of signal that existing logic analyzers cannot usefully reconstruct.

FIG. 5 shows the data acquired from the actual signals of FIGS. 2(B) and 2(C) when asynchronously sampled by each of the signals of FIGS. 2(D) through 2(H). If the signal of 2(B) is reconstructed only from the samples of one sampling signal, namely that of FIG. 2(D), a reconstruction shown in FIG. 3(A) would be the result. This is a typical way that logic signals are acquired and reconstructed in existing logic analyzers. The edges of the reconstructed logic signals can only occur at the boundaries of the defined intervals. If that same signal is reconstructed from samples taken by the signal of FIG. 2(E), a different waveform results, that given in FIG. 3(B). That result is no closer to the actual signal and shows that the error resulting from reconstructing signals from samples acquired with a single asynchronous sample clock can give an error of time of up to nearly one full interval. That is the resolution limit of such a logic analyzer.

Figure 3:
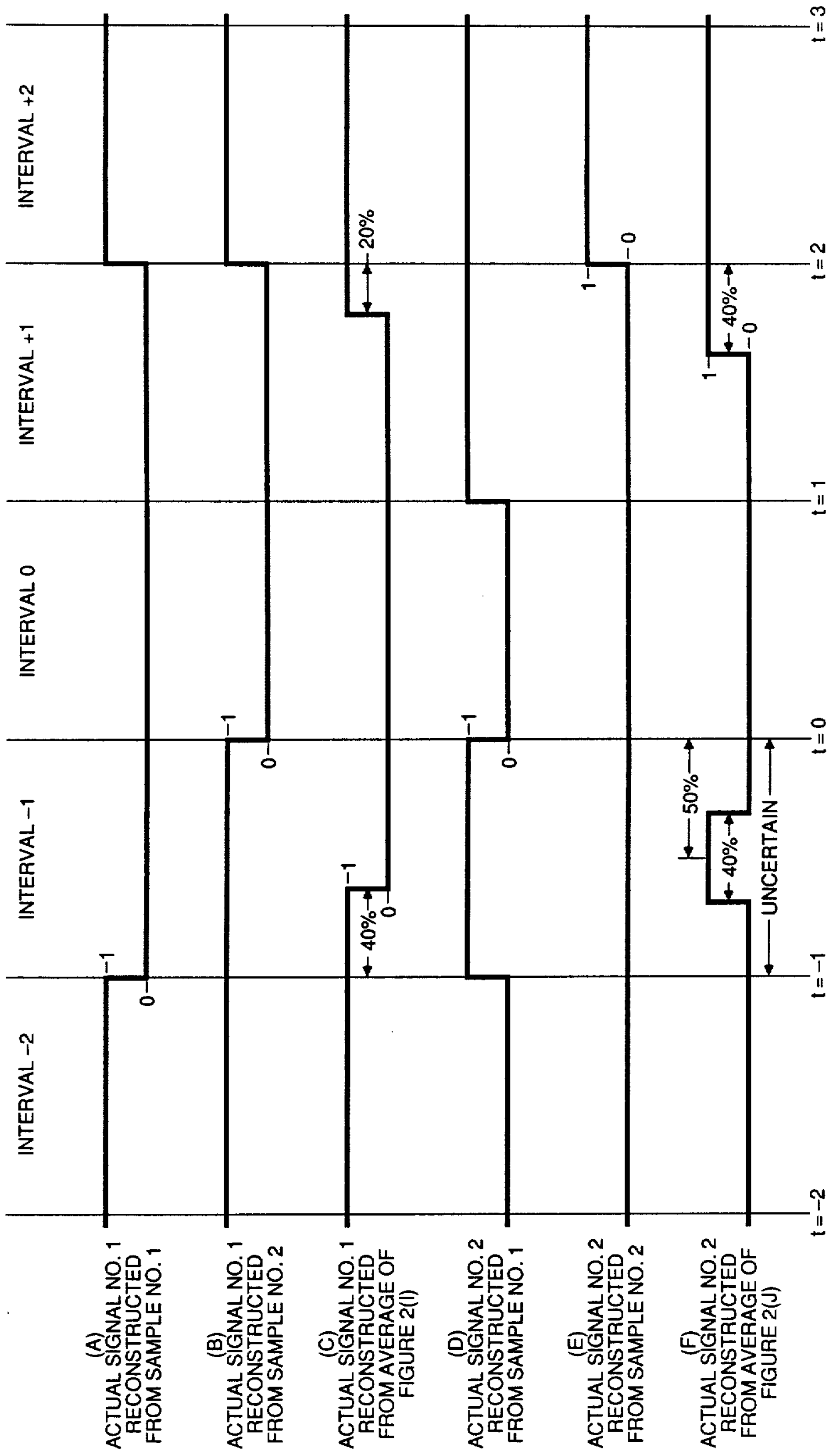
FIGS. 3(A) through 3(F) show an example of signals being reconstructed from samples acquired in accordance with FIG. 2.

The usual reaction to that limitation is to increase the clock sample frequency, thus decreasing the time between the samples and shortening the width of the intervals defined in FIGS. 2 and 3.

However, according to one specific aspect of the present invention, the resolution of the signal reconstruction is dramatically increased without having to increase the sampling clock frequency. This is accomplished by using, in this example, all five of the samples. Those samples are shown in FIG. 5. In addition, the total number of 1's sampled in each of the intervals is determined and used. That total is also shown in a different way in FIG. 2(I). In those intervals where all the samples are 1's, such as in interval −2, a reconstructed signal shown in FIG. 3(C) will be uniform throughout. But in interval −1, the process and advantages of the new technique are quite apparent. It is known from the samples acquired that two of the five samples in that interval were 1's, or 40% of the samples taken in interval −1. Assuming there are enough samples taken in interval −1 and that they are somewhat random, the result indicates an edge of the reconstructed signal to be located within the interval −1 a distance 40% from a boundary (edge) of the interval where the signal was already known to be a "1". Alternatively, the signal edge could be determined to be 60% of the interval width from the interval boundary where the signal is known to be a "0." The result is the same in either case: a "1" to "0" transition 40% of the interval width from the left edge of the interval. It will be noted from comparing the reconstruction of FIG. 3(C) to that of the actual signal of FIG. 2(B) that the edge has properly been located.

Similarly, an edge is reconstructed in interval +1. The total number of 1's detected by the samples in interval +1 is 1, or 20%. The signal edge is thus measured 20% of the distance across interval +1 from its boundary adjacent an interval having a known "1" at the right interval boundary. This also forms an edge in the reconstruction of FIG. 3(C) that corresponds in location to that of the actual signal of FIG. 2(B).

A signal is reconstructed from the samples by using a technique of moving in one time direction from a boundary having a known logic signal level. It is possible by this technique to proceed to accurately determine transition positions (signal edges) in many adjacent intervals so long as no more than one transition occurs within a time interval. As shown from the example of actual signal no. 2 in FIG. 2(C), discussed further below, a condition as in intervals −1 and +1 where more than one transition occurs within a time interval, inaccurate results can occur. Such inaccurate results obtained by the method being described are nevertheless still a significant improvement over the results obtained by a single measurement per interval.

In implementing this technique, it is necessary that all samples in at least one interval are all 1's or all 0's. This is assured if the signal being sampled has at least two consecutive transitions separated by at least two sampling periods. This then provides at least two known starting boundary conditions from which the signal can be reconstructed, one interval at a time proceeding away from the known boundary signal levels. If samples from a signal indicate that there is no such starting interval, the sample period should be decreased and a new set of samples acquired.

Therefore, it can be seen that the ability of a logic analyzer using the technique just described to acquire and process sample data provides much better results without having to follow the usual technique of increasing the clock frequency. The examples being described with respect to the Figures are, of course, much simplified in order to make it easier to explain and understand. The examples of waveforms and sampling patterns have been chosen to show good results since such results will usually be obtainable only with use of a much larger number of samples, perhaps as many as 50 or 100, taken over a much larger time period, such as about 50 or more intervals. A second example, given later with respect to FIG. 9 and the three Tables of the Appendix, approach a better real-life simulation of an actual implementation of the present invention. The examples of FIGS. 2-8 have been simplified to aid in an understanding of the principles involved in the various aspects of the present invention.

The second actual signal of FIG. 2(C), when sampled by the same five signals of FIGS. 2(D) through 2(H), provide the samples given in FIG. 7. A signal reconstructed from only the samples acquired by the sampling signal of FIG. 2(D) is given in FIG. 3(D). This obviously looks nothing like the actual signal of FIG. 2(C). FIG. 3(E) shows another reconstruction, this time with samples acquired by the sampling signal of FIG. 2(E), but it also is far from an accurate representation of the initial signal that was sampled. FIG. 3(F), showing the results of reconstruction by the averaging technique described with respect to FIG. 3(C), also gives an erroneous result in this case. There is, of course, no problem when each sample within an interval is the same, such as in intervals −2, 0 and +2. But the samples of the remaining two intervals have both 0's and 1's. A reconstruction in interval +1 provides an edge 40% from the right border of the interval, but that is incorrect, as can be seen by comparison with the actual signal of FIG. 2(C) that was sampled. The results in interval −1 are uncertain, as shown in FIG. 3(F), since it is known that there is some transition in that interval, but positioning it according to the averaging technique described is not definitive since the signals at the adjacent interval boundaries are the same, namely both 0. Attempting to position the signal edge relative to the left boundary will produce a result different from the result obtained when positioning the signal edge relative to the right boundary. Therefore, the best estimate is to position a positive pulse in the middle of the interval, and having a width equal to 40% of the interval.

Therefore, although the averaging technique for reconstructing a signal from acquired data, as described with respect to FIG. 3(C) is highly useful for actual signals having only one transition in each interval, something more is needed to accurately process and reconstruct a signal having two or more edges in an interval. Such a further technique is provided, according to another specific aspect of the present invention. This further technique is illustrated with respect to the same actual signals of FIGS. 2(B) and 2(C) and the same five sampling signals of FIGS. 2(D) through 2(H). A flow diagram of FIG. 4 generally outlines the technique, with reference to example calculations of FIGS. 6 and 8.

Figure 4:
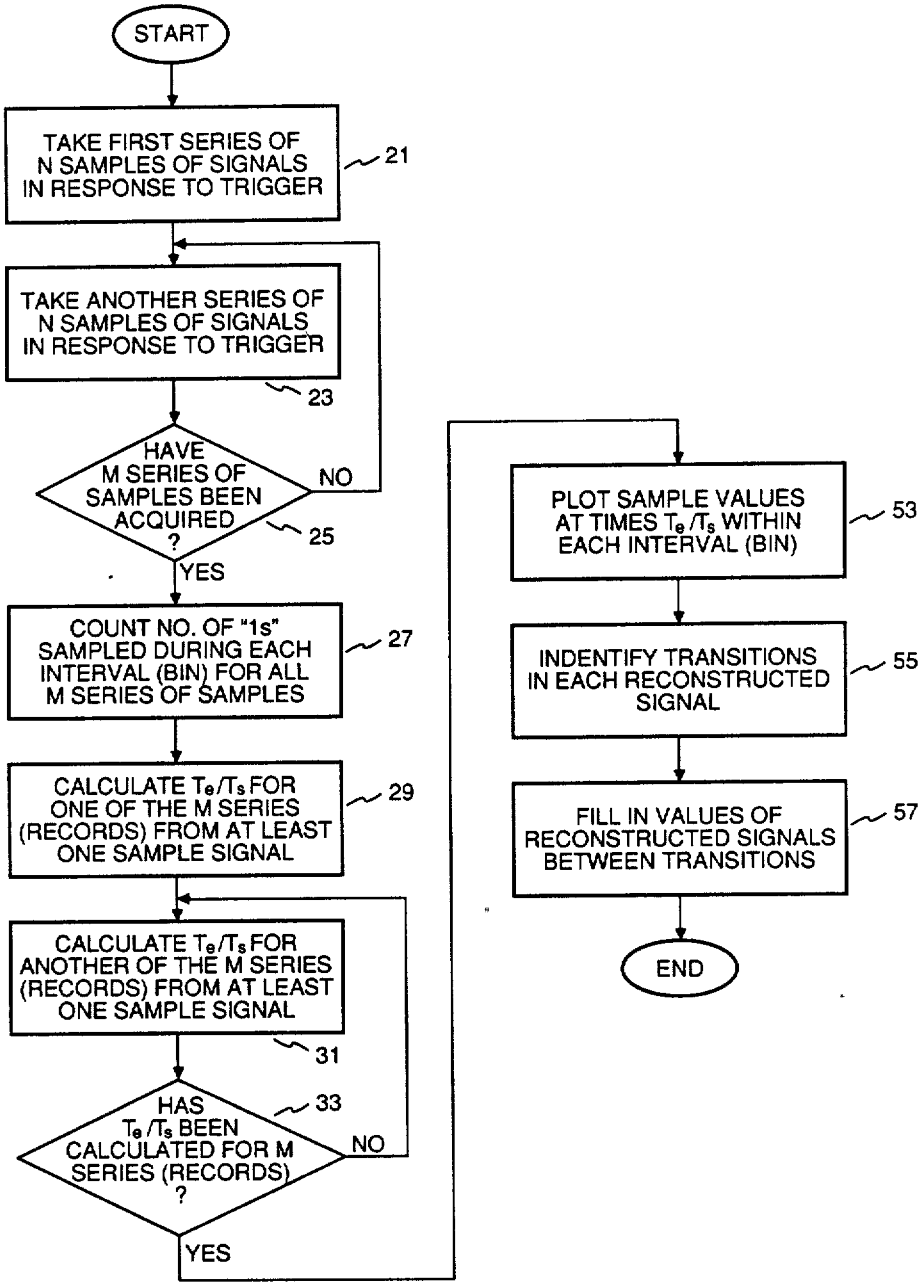
FIG. 4 is a flow diagram that illustrates a general implementation of the various aspects of the present invention.

Steps 21, 23 and 25 of FIG. 4 have already been described. That is, a first series of samples is taken of the actual signals of FIGS. 2(B) and 2(C) by a sampling signal of FIG. 2(D) in step 21, and in step 23 the additional samples are taken by the sampling signals of FIGS. 2(E) through 2(H), one at a time, until complete. A step 27 indicates that the number of data 1's that are sampled in each interval are counted. The specific samples acquired and the total number of 1's for each interval are given in FIG. 5 for the actual signal of FIG. 2(B), and in FIG. 7 for the actual signal of FIG. 2(C).

Processing steps 29, 31, and 33, illustrated in FIG. 4, have not yet been described. Those steps recite that the timing of each of the sampling signals of FIGS. 2(D) through 2(H) is to be calculated by comparing each of the individual sample records acquired by steps 21, 23 and 25, with the interval sample totals determined in step 27. FIG. 6 illustrates an example set of data acquired from the signals of FIG. 2 as a means of showing the calculations of the steps 29, 31 and 33. The notation "Te/Ts" refers to the "estimated" location of each sampling edge within its interval, measured as a fraction of the distance across the interval from the left border thereof.

Referring to FIG. 6, the relative positions of the sampling signals are derived from the data of FIG. 5 taken from the actual signal of FIG. 2(B). A column 35 gives the interval number, and a column 37 gives the total number of 1's as a fractional portion of the total number of samples, which was determined in step 27 of FIG. 4. The remaining columns 39–51 shows specific calculations using the sampled data. These calculations are based upon the realization that a great deal of information can be obtained by comparing each sample record with the totals given in column 37. The data acquired by each of the sampling signals of FIGS. 2(D) through 2(H) is analyzed separately in columns 43–51, respectively.

Before describing the example calculations in detail, their general purpose can be appreciated by reference to the actual signal of FIG. 2(B). That signal has been reconstructed by the averaging technique described above and is shown in FIG. 3(C). Once the signal is effectively reconstructed by use of all the data, then the data from each sampling record is individually compared to it in order to determine the relative timing of the sampling signal. If, for example, a sample in interval −1 shows a data value of 1, it is known that that sample has to exist somewhere from the left boundary of interval −1 to the actual signal edge four tenths of the way across. This data was obtained in that interval for the samples of FIGS. 2(E) and 2(H). This observation provides some boundaries around the relative timing of the sampling signals of FIGS. 2(E) and 2(H) with respect to the defined intervals. Similarly, since the other three samples of the signal of FIG. 2(B) show a 0, it is known that they exist somewhere between 0.4 of the way across interval −1 and the right hand boundary. Of course, no useful information defining the location of the sampling edges can be determined from intervals −2, 0 and +2 since the actual signal is uniform throughout those intervals.

But since interval +1 also has a transition, further limits on the timing of the sampling signals can be deduced from their sample values when compared to the calculated edge location of the reconstructed signals shown in FIG. 3(C). The sampling signal of FIG. 2(G), for example, provides the only data value of 1 in interval +1, so it is known that that sampling signal must lie somewhere between 0.8 and 1.0 of the way across interval +1 from the left-hand boundary. Similarly, the remaining samples are known to exist between the left-hand boundary and 0.8 of the way across the interval. The location of the edges of both the reconstructed and actual signals are the same, as can be seen by comparing FIGS. 3(C) and 2(B).

Additional information can be derived from looking at both interval −1 and interval +1 together. For example, with respect to the sampling signal of FIG. 2(D), the relative data acquired by it of 0's indicates that the samples have to be to the right of 0.4, as indicated in interval −1, and to the left of 0.8, as indicated by interval +1. Stated another way, the location of the sampling signal of FIG. 2(D) must lie within 0.4 to 0.8. A good guess would be midway between, 0.6, which is not too far from the actual position of 0.5. As additional edges of the signal are available in other intervals not shown in FIG. 2, the calculation can become more precise.

Referring again to FIG. 6, the example there shows a more formalized technique for estimating the location within the intervals of each of the sampling edges of the five sampling signals. Column 39 identifies a range that is greater than (>) in a left-hand sub-column and an upper limit in a right-hand sub-column indicated to be less than (<), when a particular sample is 0. Similarly, column 41, in two sub-columns, gives a range of sample positions in each interval where the sample data of a particular record is 1. The ranges of columns 39 and 41 are derived from the average number of 1's indicated in column 37. For interval −2, since all the samples are 1, has nothing in the 0 data sample column 39, but has the full range of from 0 (the left-hand boundary of an interval) to 1.0 (the right-hand boundary of that interval) in column 41.

For interval −1, reading across the row of information given in FIG. 6, a sample of 0's shows that sampling signal to be located between 0.4 and 1.0 of that interval since anything less than 0.4 must be a 1, as previously described. Indeed, that range of 0 to 0.4 is given in column 41 to indicate that sample 1 in interval −1 means that the sampling signal timing must be positioned between 0 and 0.4 of the way across the interval from the left side.

The remaining columns 43–51 merely transfer the range from either column 39 or 41 to it, independently for each interval number, depending upon whether the data sampled by that signal in that interval is a 1 or a 0. For example, in column 43 for the sampling signal of FIG. 2(D), the range for interval −1 is stated to be 0.4 to 1.0, that of column 39, since the data sampled by that signal in interval −1 is a 0. Looking to column 45 for interval −1, the opposite occurs, namely the range of column 41 for that interval is transferred to column 45 since the data sampled in interval −1 by the sampling signal of FIG. 2(E) is a 1. All of the columns 43–51 are completed in the same manner for each of the intervals.

After columns 43–51 are so completed, a range in which the relative timing of each sample signal has to occur is given at the bottom of each column. For the sampling signal of FIG. 2(D), given in column 43, the range of 0.4 to 0.8 is again obtained, as previously described. The estimated location of the sample is taken to be midway in that range, namely 0.6. This range is obtained by taking the highest number of the left-hand sub-column of column 43 as the lowermost boundary of the range, and the lowest number of the right-hand column is taken to be the high end of that range. Why that works is apparent from looking at FIGS. 2(D) and 2(E) wherein both samples in intervals −1 and +1 and thus must lie somewhere in the range of the right of the edge of the actual signal of FIG. 2(B) in interval −1, and to the left of that signal in interval +1. A similar analysis by using the two pieces of information of those intervals can be done for each of the other samples in order to intuitively show the correctness of the data analysis that is formalized in FIG. 6. Of course, the more intervals having actual signal edges, the more data that is available for estimating the timing of each sample signal, and the range obtained by the procedure illustrated in FIG. 6 will be reduced to closer surround the actual location value and thus improve the accuracy of the estimates.

The actual signal of FIG. 2(B) is used to determine the relative timing of the sampling signals by the process illustrated with respect to FIG. 6 because that signal has no more than one transition per defined interval. When acquiring a number of logic signals from a system under test, it may not be known which of those satisfy that characteristic, since multiple transitions within any interval will give erroneous results. However, the results of the analysis of FIG. 6 will reveal the fact of the analysis being based upon an actual signal having more than one transition in any one interval. This will become apparent from the calculated ranges for each of the sampling signals. One or more of those ranges will have a lower end that is higher than the higher end. Therefore, the instrument's processing can make this simple check to determine whether the actual signal upon which the calculations have been made is a proper one or not. If not, calculations are made on another signal suspected to be acceptable for that purpose, and so on, until a proper one is found.

The process described with respect to FIG. 6 does not aid in learning anything about the actual signal of FIG. 2(B). We already know, because it has no more than one transition in any interval, the location of its transitions with some precision, as described above with respect to FIG. 3(C). We are using that known signal to learn the relative locations of each of the samples within the intervals. From that, we then know the location of the data acquired from other signals that are in a fixed time relationship with the reference signal of FIG. 2(B), such as the additional actual signal of FIG. 2(C). Data of all such signals is acquired at the same time by the samples. Further processing steps 53, 55 and 57 of FIG. 4, are directed to accurately reconstructing from the acquired data the waveform of additional actual signals, such as that of FIG. 2(C), even if they have a plurality of transitions in any one interval. The operation of this part of the process is also illustrated with respect to FIG. 8.

A step 53 of FIG. 4 is carried out in FIG. 8(A) with respect to the data acquired from the actual signal of FIG. 2(C) by the sampling signals of FIGS. 2(D)–2(H), this acquired data being shown in FIG. 7. FIG. 8 only shows one interval, for simplicity. The interval −1 has the value of the data acquired by each of the five sampling signals in that interval, plotted vertically in the graph of FIG. 8(A), while their horizontal position is determined by the Te/Ts values calculated by the procedure of FIG. 6. The data 1's obtained by the sampling signals of FIGS. 2(D) and 2(F) are plotted as such as 0.6 of the way across the interval from the left boundary, as calculated in columns 43 and 47 of FIG. 6. These values happen to fall on top of each other. Similarly, the other three data values are plotted in FIGS. 8(A).

A next step 55 of FIG. 4 is to determine where the transitions exist between the sampled 1's of the signal and the 0's. This is illustrated in FIG. 8(B) for the signal interval −1. This is accomplished by assuming the transition (edge) of the actual signal occurs midway between acjacent sample points of opposite value. For example, an edge 59 is calculated to exist at 0.75 of the distance across the width of the interval −1, halfway between 0.6 and 0.9 of the adjacent plotted data values in FIG. 8(A) having opposite value. Similarly, an edge 61 is calculated to have the position shown in FIG. 8(B).

A next, and final step, in reconstructing a signal from the acquired data base of the signal of FIG. 2(C), is to fill in values between the calculated edges, all 1's in the region between the edges 59 and 61 and all 0's elsewhere in interval −1. Comparision of the reconstructed signal of FIG. 8(C) with that in interval −1 of the actual sampled signal of FIG. 2(C) is quite favorable.

That completes a general, even though somewhat detailed description of the calculation process for reconstructing data signals. As previously explained, the few number of intervals and sample signals used in the foregoing description make it easy to explain, but will not give results that have an accuracy desired for many applications. But the results are better than those which can be obtained by current techniques for signals with more than one transition per time interval.

Figure 9:
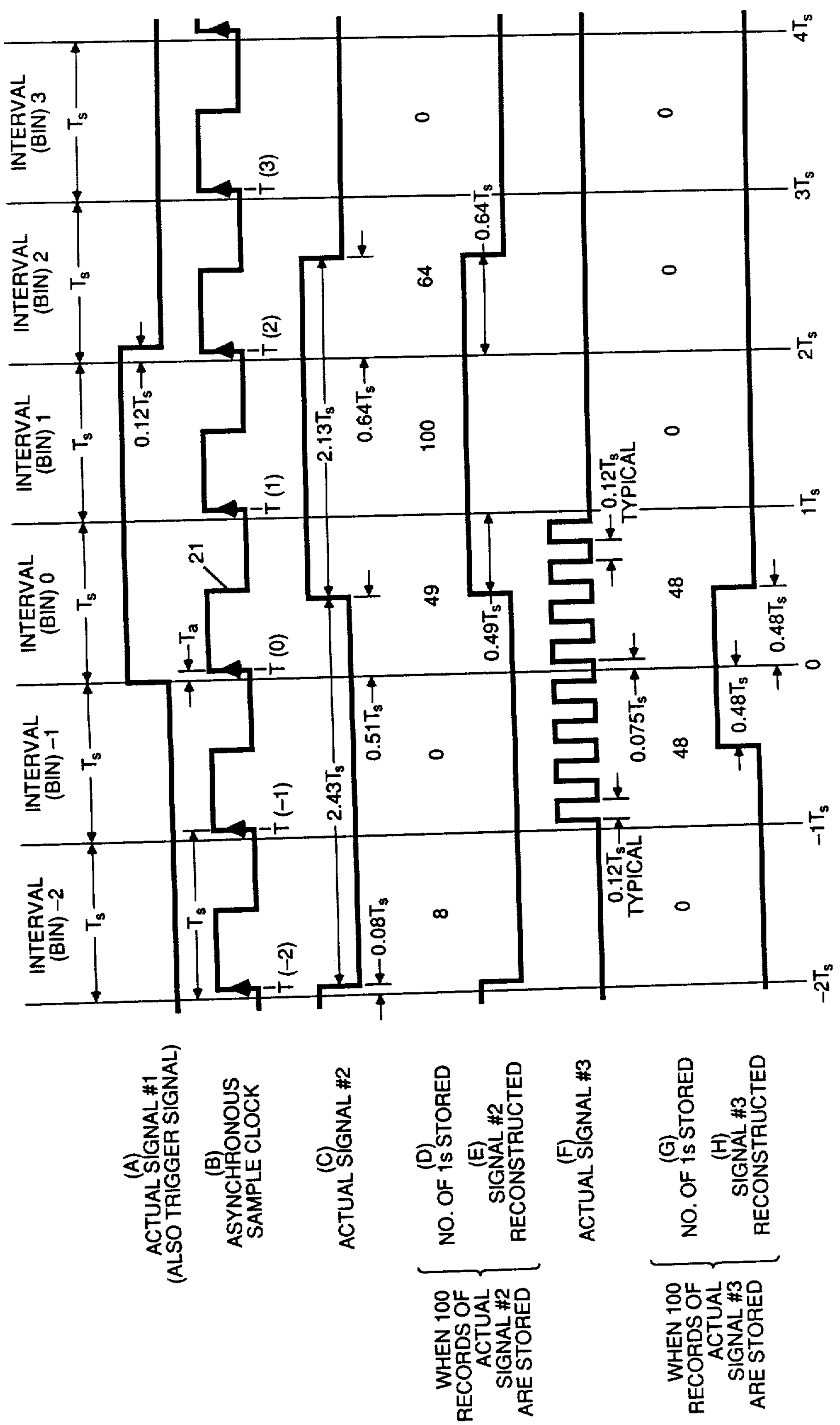
FIGS. 9(A) through 9(H) provide waveforms of another processing example of the present invention, the results therefrom being given in an Appendix to this application.

The foregoing processing is applied in another example with respect to signals illustrated in FIG. 9 and resulting data and processing given in three Tables of an Appendix hereto. Data is acquired for 61 intervals (bins), although only a few of them are shown in FIG. 9. A total of 50 sample records are acquired in this example. So it can be seen that the amount of information available for processing is considerably more than that used in the previous example. In actual applications, even more intervals (bins) and sample signals can be employed for further increased accuracy.

Referring to FIG. 9(A), a trigger signal is shown to which all of the intervals are referenced in time. FIG. 9(B) is one of the sampling clock signals, sampling all of the logic signals on the leading rising edge of each clock signal. There is one such asynchronous clock signal for each of the 50 sample records acquired, the locations of the sampling edge of the clock signals being substantially randomly distributed within the intervals.

FIG. 9(C) shows an actual signal that is used as the basis for calculating the timing of each of the sample clock signals. FIG. 9(D) totals the percentage number of 1's acquired in each of the intervals by all of the sampling signals. From that information, the reconstruction of FIG. 9(E) of the actual signal of FIG. 9(C) can be made in the manner described above with respect to FIG. 3(C).

FIG. 9(F) shows another actual signal having more than one transition in at least one sampled interval. FIG. 9(G) shows the percentage of the data samples in each interval that are 1's. FIG. 9(H) shows a reconstruction of the samples of the actual signal of FIG. 9(F) which is, for reasons discussed with respect to FIG. 3(F), an erroneous reconstruction.

Therefore, the more complicated process described above is applied to the data records of all of the actual signals. The samples acquired of the actual signal of FIG. 9(C) are given in Table I of the Appendix, in columns G01 through G50. The interval (bin) number is given in column C, corresponding to column 35 of FIG. 6. Columns A and B of Table I of the Appendix lists the exact locations of the transitions (edges) of the actual signal of FIG. 9(C), which is a periodic signal such as a system clock. FIG. 9 shows only six intervals (bins) of the actual signals. Column H of Table I gives the total number of sample data 1's in each of the intervals from all of the 50 samples, corresponding somewhat to column 37 of FIG. 6. Columns I and J of Table I correspond to column 39 of FIG. 6, and columns K and L of Table I to column 41 of FIG. 6. Columns M and N and Table I correspond to column 43 of FIG. 6, and give the calculation of the sample clock timing for record number 1. Similar calculations in two columns are accomplished for the 49 additional samples, but these calculations are not shown in Table I. Only the results of these calculations are shown in the bottom row of Table I for each of the 50 records.

Table II of the Appendix gives the data acquired by each of the 50 samples of the actual signal of FIG. 9(F). With the data shown in Table II and the estimated Te/Ts of each sampling signal that acquired that data given in Table I, a signal can be reconstructed which is very close to the actual signal of 9(F). This is accomplished in Table III in the same manner as generally described with respect to FIG. 8. The two intervals (bins) in which information is acquired are shown horizontally in Table III, divided into 100 time slots. Below each slot number is the number of the record of Table II whose estimated sample Te/Ts lies within that slot. Below that, in rows 19 and 20, the data for those records at those time slots in each of the two bins under consideration is given. This corresponds to the plot of FIG. 8(A) for the prior example.

Rows 22 and 23 of Table II determine the transitions, as was done in FIG. 8(B) in the prior example, by filling in horizontally between each of the adjacent samples that have different data values. The data edge is assumed to occur midway between such data readings, or as close thereto as can be made.

Rows 25 and 26 of Table III, in a manner similar to that illustrated in FIG. 8(C) for the prior example, fill in all the 1's and 0's necessary to complete the data of rows 22 and 23. It can be seen from the resulting reconstructed signal of rows 25 and 26 of Table III that multiple pulses within each of the intervals are clearly defined and correspond very accurately to that of the actual signal that was sampled.

Although the various aspects of the present invention have been described with respect to their preferred embodiments, it will be understood that the invention is entitled to protection within the full scope of the appended claims. For example, the techniques described are directly applicable to multi-channel, automatic test equipment (ATE).

APPENDIX

TABLE 1. FIFTY RECORDINGS OF THE LOGIC SIGNAL OF FIGURE 9(C).

Notes: 1. Memory depth is 61 bits (Bin -30 to Bin 30).
2. 50 Records are stored. R# means Record number.
3. Total number of stored bits = 50 x 61 = 3050.
4. ATE refers to the leading edge of the Active Trigger Event.
5. Ts is the time between samples, or 1/Fs where Fs is the sample rate.
6. Ta is the actual time from the ATE to the next sample.
7. Ta/Ts is a random number between 0 and 1, different for each R#.
8. Te/Ts, generated by algorithms, is the estimated value of Ta/Ts

| Row | A: In terms of Ts, and with respect to the ATE, Chan. A goes high (1) at | B: low (0) at | C: Bin No. | D: Bit = 0 except as follows: Bit = 1 if Ta/Ts is > | E: & Ta/Ts is < | F | 001 Through 050: R# 01–10 | R# 11–20 | R# 21–30 | R# 31–40 | R# 41–50 | H: Total Count | I: Algorithms: If bit=0, Te/Ts is > | J: & < | K: If bit=1, Te/Ts is > | L: & < | M: For R# 01, Te/Ts is > | N: & < |
|---|---|---|---|---|---|---|---|---|---|---|---|---|---|---|---|---|---|---|
| 1–2 | | | | | | R# | 0 0 0 0 0 0 0 0 0 1 / 1 2 3 4 5 6 7 8 9 0 | 1 1 1 1 1 1 1 1 1 2 / 1 2 3 4 5 6 7 8 9 0 | 2 2 2 2 2 2 2 2 2 3 / 1 2 3 4 5 6 7 8 9 0 | 3 3 3 3 3 3 3 3 3 4 / 1 2 3 4 5 6 7 8 9 0 | 4 4 4 4 4 4 4 4 4 5 / 1 2 3 4 5 6 7 8 9 0 | | | | | | | |
| 4–6 | | | | | | Ta/Ts | 4 9 2 6 1 9 7 4 8 7 / 5 8 3 8 7 3 6 7 5 8 / 4 5 6 8 8 7 1 2 8 2 | 5 3 5 3 0 3 2 9 7 1 / 9 4 8 3 7 9 8 8 1 8 / 6 9 5 9 9 9 8 7 6 0 | 5 4 0 2 9 4 2 9 0 0 / 6 4 6 6 0 0 9 4 1 4 / 1 2 5 7 1 9 4 3 1 5 | 0 5 1 7 9 4 1 6 7 5 / 1 7 3 1 6 2 3 1 6 3 / 1 6 5 3 4 1 3 7 8 6 | 7 5 6 0 2 7 3 0 1 2 / 9 1 8 0 5 5 3 9 7 8 / 4 2 1 6 6 1 5 2 2 8 | | | | | | | |
| 8 | | 30 | 30 | 0 | 0 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 | 0 | 1 | | | 0 | 1 |
| 9 | | | 29 | 0 | 1 | | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 50 | | | 0 | 1 | 0 | 1 |
| 10 | | | 28 | 0 | 1 | | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 50 | | | 0 | 1 | 0 | 1 |
| 11 | 27.87 | | 27 | 0.87 | 1 | | 0 1 0 0 0 1 0 0 0 0 | 0 0 0 0 0 0 0 1 0 0 | 0 0 0 0 1 0 0 1 0 0 | 0 0 0 0 1 0 0 0 0 0 | 0 0 0 0 0 0 0 0 0 0 | 6 | 0 | 0.88 | 0.88 | 1 | 0 | 0.89 |
| 12 | | | 26 | 1 | 0 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 | 0 | 1 | | | 0 | 1 |
| 13 | | 25.44 | 25 | 0 | 0.44 | | 0 0 1 0 1 0 0 0 0 0 | 0 1 0 1 1 1 1 0 0 1 | 0 0 1 1 0 1 1 0 1 0 | 0 0 1 0 0 1 0 0 0 0 | 0 0 0 1 1 1 1 1 1 1 | 22 | 0.44 | 1 | 0 | 0.44 | 0.44 | 1 |
| 14 | | | 24 | 0 | 1 | | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 50 | | | 0 | 1 | 0 | 1 |
| 15 | 23.31 | | 23 | 0.31 | 1 | | 1 1 0 1 0 1 1 1 1 1 | 1 1 1 1 0 1 0 1 1 0 | 1 1 0 0 1 1 0 1 0 1 | 1 1 0 1 1 1 0 1 1 1 | 1 1 1 0 0 1 1 0 0 0 | 34 | 0 | 0.32 | 0.32 | 1 | 0.32 | 1 |
| 16 | | | 22 | 1 | 0 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 | 0 | 1 | | | 0 | 1 |
| 17 | | | 21 | 1 | 0 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 | 0 | 1 | | | 0 | 1 |
| 18 | | 20.88 | 20 | 0 | 0.88 | | 1 0 1 1 1 0 1 1 1 1 | 1 1 1 1 1 1 1 0 1 1 | 1 1 1 1 0 1 1 0 1 1 | 1 1 1 1 0 1 1 1 1 1 | 1 1 1 1 1 1 1 1 1 1 | 44 | 0.88 | 1 | 0 | 0.88 | 0 | 0.88 |
| 19 | | | 19 | 0 | 1 | | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 50 | | | 0 | 1 | 0 | 1 |
| 20 | 18.75 | | 18 | 0.75 | 1 | | 0 1 0 0 0 1 1 0 1 1 | 0 0 0 0 0 0 0 1 0 0 | 0 0 0 0 1 0 0 1 0 1 | 1 0 0 0 0 1 0 0 0 0 | 1 0 0 0 0 1 0 0 0 0 | 13 | 0 | 0.74 | 0.74 | 1 | 0 | 0.74 |
| 21 | | | 17 | 1 | 0 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 | 0 | 1 | | | 0 | 1 |
| 22 | | 16.32 | 16 | 0 | 0.32 | | 0 0 1 0 1 0 0 0 0 0 | 0 0 0 0 1 0 1 0 0 1 | 0 0 1 1 0 0 1 0 1 0 | 0 0 1 0 0 0 1 0 0 0 | 0 0 0 1 1 0 0 1 1 1 | 16 | 0.32 | 1 | 0 | 0.32 | 0.32 | 1 |
| 23 | | | 15 | 0 | 1 | | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 50 | | | 0 | 1 | 0 | 1 |
| 24 | 14.19 | | 14 | 0.19 | 1 | | 1 1 1 1 0 1 1 1 1 1 | 1 1 1 1 0 1 1 1 1 0 | 1 1 0 1 1 1 1 1 0 1 | 1 1 0 1 1 1 0 1 1 1 | 1 1 1 0 1 1 1 0 0 1 | 40 | 0 | 0.2 | 0.2 | 1 | 0.2 | 1 |
| 25 | | | 13 | 1 | 0 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 | 0 | 1 | | | 0 | 1 |
| 26 | | | 12 | 1 | 0 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 | 0 | 1 | | | 0 | 1 |
| 27 | | 11.76 | 11 | 0 | 0.76 | | 1 0 1 1 1 0 0 1 0 0 | 1 1 1 1 1 1 1 0 1 1 | 1 1 1 1 0 1 1 0 1 0 | 0 1 1 1 0 1 1 1 1 1 | 0 1 1 1 1 1 1 1 1 1 | 38 | 0.76 | 1 | 0 | 0.76 | 0 | 0.76 |
| 28 | | | 10 | 0 | 1 | | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 50 | | | 0 | 1 | 0 | 1 |
| 29 | 9.63 | | 9 | 0.63 | 1 | | 0 1 0 1 0 1 1 0 1 1 | 0 0 0 0 0 0 0 1 1 0 | 0 0 0 0 1 0 0 1 0 1 | 1 0 0 1 1 0 0 0 0 0 | 1 0 1 0 0 1 0 0 0 1 | 18 | 0 | 0.64 | 0.64 | 1 | 0 | 0.64 |
| 30 | | | 8 | 1 | 0 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 | 0 | 1 | | | 0 | 1 |
| 31 | | 7.2 | 7 | 0 | 0.2 | | 0 0 0 0 1 0 0 0 0 0 | 0 0 0 0 1 0 0 0 0 1 | 0 0 1 0 0 0 0 0 1 0 | 0 0 1 0 0 1 0 0 0 0 | 0 0 0 1 0 0 0 1 1 0 | 10 | 0.2 | 1 | 0 | 0.2 | 0.2 | 1 |
| 32 | | | 6 | 0 | 1 | | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 50 | | | 0 | 1 | 0 | 1 |
| 33 | 5.07 | | 5 | 0.07 | 1 | | 1 1 1 1 1 1 1 1 1 1 | 1 1 1 1 1 1 1 1 1 1 | 1 1 0 1 1 1 1 1 0 1 | 1 1 1 1 1 1 1 1 1 1 | 1 1 1 0 1 1 1 1 1 1 | 47 | 0 | 0.06 | 0.06 | 1 | 0.06 | 1 |
| 34 | | | 4 | 1 | 0 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 | 0 | 1 | | | 0 | 1 |
| 35 | | | 3 | 1 | 0 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 | 0 | 1 | | | 0 | 1 |
| 36 | | 2.64 | 2 | 0 | 0.64 | | 1 0 1 0 1 0 0 1 0 0 | 1 1 1 1 1 1 1 0 0 1 | 1 1 1 1 0 1 1 0 1 0 | 0 1 1 0 0 1 1 1 0 1 | 0 1 0 1 1 0 1 1 1 1 | 32 | 0.64 | 1 | 0 | 0.64 | 0 | 0.64 |
| 37 | | | 1 | 0 | 1 | | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 50 | | | 0 | 1 | 0 | 1 |
| 38 | 0.51 | | 0 | 0.51 | 1 | | 0 1 0 1 0 1 1 0 1 1 | 0 0 1 0 0 0 1 1 0 0 | 1 0 0 0 1 0 0 1 0 1 | 1 1 0 1 1 0 0 1 1 1 | 1 1 1 0 0 1 0 0 0 0 | 24 | 0 | 0.52 | 0.52 | 1 | 0 | 0.52 |
| 39 | | | -1 | 1 | 0 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 | 0 | 1 | | | 0 | 1 |
| 40 | | -1.92 | -2 | 0 | 0.08 | | 0 0 0 0 0 0 0 0 0 0 | 0 0 0 0 1 0 0 0 0 0 | 0 0 1 0 0 0 0 0 1 0 | 0 0 0 0 0 0 0 0 0 0 | 0 0 0 1 0 0 0 0 0 0 | 4 | 0.08 | 1 | 0 | 0.08 | 0.08 | 1 |
| 41 | | | -3 | 0 | 1 | | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 50 | | | 0 | 1 | 0 | 1 |
| 42 | | | -4 | 0 | 1 | | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 50 | | | 0 | 1 | 0 | 1 |
| 43 | -4.05 | | -5 | 0.95 | 1 | | 0 1 0 0 0 0 0 0 0 0 | 0 0 0 0 0 0 1 0 0 0 | 0 0 0 0 0 0 0 0 0 0 | 0 0 0 0 0 0 0 0 0 0 | 0 0 0 0 0 0 0 0 0 0 | 2 | 0 | 0.96 | 0.96 | 1 | 0 | 0.96 |
| 44 | | | -6 | 1 | 0 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 | 0 | 1 | | | 0 | 1 |
| 45 | | -6.48 | -7 | 0 | 0.52 | | 1 0 1 0 1 0 0 1 0 0 | 1 1 0 1 1 1 1 0 0 1 | 0 1 1 1 0 1 1 0 1 0 | 0 0 1 0 0 1 1 0 0 0 | 0 1 0 1 1 0 1 1 1 1 | 27 | 0.54 | 1 | 0 | 0.54 | 0 | 0.54 |
| 46 | | | -8 | 0 | 1 | | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 50 | | | 0 | 1 | 0 | 1 |
| 47 | -8.61 | | -9 | 0.39 | 1 | | 1 1 0 1 0 1 1 1 1 1 | 1 0 1 0 0 1 0 1 1 0 | 1 1 0 0 1 1 0 1 0 1 | 1 1 0 1 1 1 0 1 1 1 | 1 1 1 0 0 1 0 0 0 0 | 31 | 0 | 0.38 | 0.38 | 1 | 0.38 | 1 |
| 48 | | | -10 | 1 | 0 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 | 0 | 1 | | | 0 | 1 |
| 49 | | | -11 | 1 | 0 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 | 0 | 1 | | | 0 | 1 |
| 50 | | -11.04 | -12 | 0 | 0.96 | | 1 0 1 1 1 1 1 1 1 1 | 1 1 1 1 1 1 1 0 1 1 | 1 1 1 1 1 1 1 1 1 1 | 1 1 1 1 1 1 1 1 1 1 | 1 1 1 1 1 1 1 1 1 1 | 48 | 0.96 | 1 | 0 | 0.96 | 0 | 0.96 |
| 51 | | | -13 | 0 | 1 | | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 50 | | | 0 | 1 | 0 | 1 |
| 52 | -13.17 | | -14 | 0.83 | 1 | | 0 1 0 0 0 1 0 0 1 0 | 0 0 0 0 0 0 1 0 0 0 | 0 0 0 0 1 0 0 1 0 1 | 0 0 0 0 1 0 0 0 0 0 | 0 0 0 0 0 0 0 0 0 0 | 8 | 0 | 0.84 | 0.84 | 1 | 0 | 0.84 |
| 53 | | | -15 | 1 | 0 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 | 0 | 1 | | | 0 | 1 |
| 54 | | -15.6 | -16 | 0 | 0.4 | | 0 0 1 0 1 0 0 0 0 0 | 0 1 0 1 1 1 1 0 0 1 | 0 0 1 1 0 0 1 0 1 0 | 0 0 1 0 0 0 1 0 0 0 | 0 0 0 1 1 0 1 1 1 1 | 20 | 0.4 | 1 | 0 | 0.4 | 0.4 | 1 |
| 55 | | | -17 | 0 | 1 | | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 50 | | | 0 | 1 | 0 | 1 |
| 56 | -17.73 | | -18 | 0.27 | 1 | | 1 1 0 1 0 1 1 1 1 1 | 1 1 1 1 0 1 0 1 1 0 | 1 1 0 0 1 1 1 1 0 1 | 1 1 0 1 1 1 0 1 1 1 | 1 1 1 0 0 1 1 0 0 1 | 36 | 0 | 0.28 | 0.28 | 1 | 0.28 | 1 |
| 57 | | | -19 | 1 | 0 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 | 0 | 1 | | | 0 | 1 |
| 58 | | | -20 | 1 | 0 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 | 0 | 1 | | | 0 | 1 |
| 59 | | -20.16 | -21 | 0 | 0.84 | | 1 0 1 1 1 0 1 1 0 1 | 1 1 1 1 1 1 1 0 1 1 | 1 1 1 1 0 1 1 0 1 0 | 1 1 1 1 0 1 1 1 1 1 | 1 1 1 1 1 1 1 1 1 1 | 42 | 0.84 | 1 | 0 | 0.84 | 0 | 0.84 |
| 60 | | | -22 | 0 | 1 | | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 50 | | | 0 | 1 | 0 | 1 |
| 61 | -22.29 | | -23 | 0.71 | 1 | | 0 1 0 0 0 1 1 0 1 1 | 0 0 0 0 0 0 0 1 1 0 | 0 0 0 0 1 0 0 1 0 1 | 1 0 0 1 1 0 0 0 0 0 | 1 0 0 0 0 1 0 0 0 0 | 15 | 0 | 0.7 | 0.7 | 1 | 0 | 0.7 |
| 62 | | | -24 | 1 | 0 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 | 0 | 1 | | | 0 | 1 |
| 63 | | -24.72 | -25 | 0 | 0.28 | | 0 0 1 0 1 0 0 0 0 0 | 0 0 0 0 1 0 1 0 0 1 | 0 0 1 1 0 0 0 0 1 0 | 0 0 1 0 0 0 1 0 0 0 | 0 0 0 1 1 0 0 1 1 0 | 14 | 0.28 | 1 | 0 | 0.28 | 0.28 | 1 |
| 64 | | | -26 | 0 | 1 | | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 1 1 1 1 1 1 1 1 1 1 | 50 | | | 0 | 1 | 0 | 1 |
| 65 | -26.85 | | -27 | 0.15 | 1 | | 1 1 1 1 1 1 1 1 1 1 | 1 1 1 1 0 1 1 1 1 1 | 1 1 0 1 1 1 1 1 0 1 | 1 1 0 1 1 1 0 1 1 1 | 1 1 1 0 1 1 1 0 1 1 | 43 | 0 | 0.14 | 0.14 | 1 | 0.14 | 1 |
| 66 | | | -28 | 1 | 0 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 | 0 | 1 | | | 0 | 1 |
| 67 | | | -29 | 1 | 0 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 | 0 | 1 | | | 0 | 1 |
| 68 | | -29.28 | -30 | 0 | 0.72 | | 1 0 1 1 1 0 0 1 0 0 | 1 1 1 1 1 1 1 0 1 1 | 1 1 1 1 0 1 1 0 1 0 | 0 1 1 1 0 1 1 1 1 1 | 0 1 1 1 1 0 1 1 1 1 | 37 | 0.74 | 1 | 0 | 0.74 | 0 | 0.74 |
| 70–71 | Te/Ts. (Read down) ----> | | | | | | 4 9 2 6 1 9 8 4 9 0 / 0 8 4 7 7 2 0 8 6 0 | 4 3 5 3 0 3 2 9 7 1 / 8 5 9 5 7 9 4 8 2 7 | 5 4 0 2 9 4 3 9 0 0 / 9 8 3 4 2 2 0 2 3 6 | 0 5 1 7 9 4 1 5 6 5 / 0 9 1 2 2 2 1 9 7 9 | 0 5 6 0 2 7 3 1 1 3 / 0 3 7 3 4 5 5 1 7 0 | | | | | | | |

Te/Ts is between 0.44 & 0.52

Te/Ts is the midpoint, or 0.48

TABLE II. FIFTY RECORDINGS OF THE LOGIC SIGNAL OF FIGURE 9(F) (See Notes in TABLE II.

| COL--> | A | B | C | F | 501 Through 550 | | | | |
|---|---|---|---|---|---|---|---|---|---|
| Row 1 | In terms of Ts, and | | | R / | 0 0 0 0 0 0 0 0 0 1 | 1 1 1 1 1 1 1 1 1 2 | 2 2 2 2 2 2 2 2 2 3 | 3 3 3 3 3 3 3 3 3 4 | 4 4 4 4 4 4 4 4 4 5 |
| 2 | with respect to the | | | # \ | 1 2 3 4 5 6 7 8 9 0 | 1 2 3 4 5 6 7 8 9 0 | 1 2 3 4 5 6 7 8 9 0 | 1 2 3 4 5 6 7 8 9 0 | 1 2 3 4 5 6 7 8 9 0 |
| 3 | ATE, Chan. A goes | | | | | | | | |
| 4 | | | | / | . . . . . . . . . . | . . . . . . . . . . | . . . . . . . . . . | . . . . . . . . . . | . . . . . . . . . . |
| 5 | high | low | Bin | Ta/Ts | 4 9 2 6 1 9 7 4 8 7 | 5 3 5 3 0 3 2 9 7 1 | 5 4 0 2 9 4 2 9 0 8 | 8 5 1 7 9 4 1 6 7 5 | 7 5 6 0 2 7 3 0 1 2 |
| 6 | (1) at | (0) at | No. | | 5 8 3 8 7 3 6 7 5 8 | 0 4 8 3 7 9 0 8 1 8 | 6 4 6 6 0 0 9 4 1 4 | 1 7 3 1 4 2 3 1 0 5 | 9 1 8 1 0 5 2 8 2 8 |
| 7 | | | | \ | 4 5 6 8 8 7 1 2 3 2 | 6 9 5 9 9 9 8 7 6 0 | 1 2 5 7 1 9 4 3 1 5 | 1 0 5 3 4 1 3 7 8 6 | 4 2 1 6 6 1 5 2 2 8 |
| 8 | | | 30 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 9 | | | 29 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 10 | | | 28 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 11 | | | 27 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 12 | | | 26 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 13 | | | 25 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 14 | | | 24 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 15 | | | 23 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 16 | | | 22 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 17 | | | 21 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 18 | | | 20 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 19 | | | 19 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 20 | | | 18 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 21 | | | 17 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 22 | | | 16 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 23 | | | 15 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 24 | | | 14 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 25 | | | 13 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 26 | | | 12 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 27 | | | 11 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 28 | | | 10 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 29 | | | 9 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 30 | | | 8 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 31 | | | 7 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 32 | | | 6 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 33 | | | 5 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 34 | 0.795 | 0.915 | 4 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 35 | 0.555 | 0.675 | 3 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 36 | 0.315 | 0.435 | 2 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 37 | 0.075 | 0.195 | 1 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 38 | ----------- | ----------> | 0 | | 0 0 0 0 1 0 0 0 1 0 | 0 1 1 1 1 1 0 0 0 1 | 1 0 0 0 1 1 0 0 0 1 | 1 1 1 0 0 1 1 1 0 1 | 0 0 0 0 0 0 1 1 1 0 |
| 39 | ----------- | ----------> | -1 | | 1 0 0 1 1 1 0 1 1 0 | 0 0 0 0 0 1 1 0 0 1 | 0 1 0 0 1 1 0 1 0 1 | 0 0 1 1 1 1 1 1 1 0 | 0 0 1 0 1 0 0 0 1 0 |
| 40 | -0.165 | -0.045 | -2 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 41 | -0.405 | -0.285 | -3 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 42 | -0.645 | -0.525 | -4 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 43 | -0.885 | -0.765 | -5 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 44 | | | -6 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 45 | - | | -7 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 46 | | | -8 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 47 | | | -9 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 48 | | | -10 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 49 | | | -11 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 50 | | | -12 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 51 | | | -13 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 52 | | | -14 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 53 | | | -15 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 54 | | | -16 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 55 | | | -17 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 56 | | | -18 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 57 | | | -19 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 58 | | | -20 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 59 | | | -21 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 60 | | | -22 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 61 | | | -23 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 62 | | | -24 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 63 | | | -25 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 64 | | | -26 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 65 | | | -27 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 66 | | | -28 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 67 | | | -29 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 68 | | | -30 | | 0 0 0 0 0 0 0 0 0 0 | 0 0 0 0 0 0 0 0 0 0 | 0 0 0 0 0 0 0 0 0 0 | 0 0 0 0 0 0 0 0 0 0 | 0 0 0 0 0 0 0 0 0 0 |
| 69 | | | | | | | | | |
| 70 | | | | / | . . . . . . . . . . | . . . . . . . . . . | . . . . . . . . . . | . . . . . . . . . . | . . . . . . . . . . |
| 71 | Ta/Ts. (Read down) ----> | | | ( | 4 9 2 6 1 9 8 4 8 8 | 4 3 5 3 0 3 2 9 7 1 | 5 4 0 2 9 4 3 9 0 8 | 8 5 1 7 7 4 1 5 6 5 | 8 5 6 0 2 7 3 1 1 3 |
| 72 | | | | \ | 3 8 4 7 7 2 0 8 6 0 | 8 5 9 5 7 9 4 8 2 7 | 9 8 3 4 2 2 0 2 3 6 | 0 9 1 2 2 2 1 9 7 9 | 0 3 7 3 4 5 5 1 7 0 |

```
II. BINS 0 AND -1 OF FIGURE 9(F) EXPANDED INTO 100 EQUAL SLOTS
--------------------------------------------------------------------------------------------------------------------------------
Col-->|        B         |<----------------------------------- C0 Through C99 ----------------------------------->|
--------------------------------------------------------------------------------------------------------------------------------
Row  1|  Slot          / |0000000000|1111111111|2222222222|3333333333|4444444444|5555555555|6666666666|7777777777|8888888888|9999999999|
    2|   numbers:     \ |0123456789|0123456789|0123456789|0123456789|0123456789|0123456789|0123456789|0123456789|0123456789|0123456789|
    3|------------------------------------------------------------------------------------------------------------------------
    4|              / |   2   1  | 3     0  |    0     |2    1   1|  2     0 |   4    1 |      0   |  1  4    |0     0   |  0     0 |
    5|              | |   3   5  | 3     5  |    3     |7    2   6|  6     1 |   2    3 |      4   |  9  6    |7     9   |  6     2 |
    6|  Actual      | |          |          |          |          |          |          |          |          |          |          |
    7|  Signal #3   | |   2      | 3     2  |    1     |5    1    |  3     0 |        2 |      3   |  3       |1     3   |  2     1 |
    8|  (FIGURE 9(C)) |   9      | 7     0  |    7     |0    4    |  6     8 |        1 |      9   |  4       |0     0   |  5     8 |
    9|  Record      | |          |          |          |          |          |          |          |          |          |          |
   10|  numbers   /   |   4      |       4  |    2     |     4    |        1 |        3 |      4   |          |3         |  2       |
   11|  used:    <    |   4      |       9  |    4     |     7    |        1 |        2 |      3   |          |1         |  9       |
   12|  (Read     \   |          |          |          |          |          |          |          |          |          |          |
   13|   down)      | |          |          |    4     |          |        2 |        3 |          |          |4         |  3       |
   14|              | |          |          |    5     |          |        2 |        9 |          |          |1         |  5       |
   15|              | |          |          |          |          |          |          |          |          |          |          |
   16|              | |          |          |          |          |          |        4 |          |          |          |          |
   17|              \ |          |          |          |          |          |        0 |          |          |          |          |
   18|------------------------------------------------------------------------------------------------------------------------
   19|From above | Bin  0|   0   1  | 1     1  |    0     |0    1   1|  1     0 |   0    1 |      *   |  0  0    |*     1   |  *     0 |
   20|  Records: | Bin -1|   0   0  | 1     1  |    *     |0    0   1|  1     * |   0    * |      1   |  *  0    |0     1   |  1     0 |
   21|------------------------------------------------------------------------------------------------------------------------
   22|Xitions    | Bin  0|   00011  | 1     111|10000     |000111   1|  1111000 |   0000111|1111110000|000  00000|0111111111|111000000 |
   23| filled in:| Bin -1|   0   000|11     111|1111000000|0    00011|  11111100|0000000000|0111111111|110000    |0000111   |   111100 |
   24|------------------------------------------------------------------------------------------------------------------------
   25|Completely | Bin  0|0000001111|1111111111|1000000000|0001111111|1111110000|0000001111|1111110000|0000000000|0111111111|1110000000|
   26| filled in:| Bin -1|0000000000|1111111111|1111000000|0000000011|1111111100|0000000000|0111111111|1100000000|0000111111|1111110000|
   27|------------------------------------------------------------------------------------------------------------------------
   28|     Actual Bin  0 |0000000011|1111111111|0000000000|0011111111|1111000000|0000001111|1111111100|0000000000|1111111111|1100000000|
   29|  Filled in Bin  0 |0000001111|1111111111|1000000000|0001111111|1111110000|0000001111|1111110000|0000000000|0111111111|1110000000|
   30|------------------------------------------------------------------------------------------------------------------------
   31|     Actual Bin -1 |0000000000|0011111111|1111000000|0000001111|1111111100|0000000000|1111111111|1100000000|0000111111|1111110000|
   32|  Filled in Bin -1 |0000000000|1111111111|1111000000|0000000011|1111111100|0000000000|0111111111|1100000000|0000111111|1111110000|
--------------------------------------------------------------------------------------------------------------------------------
```

EXPLAINATION OF HOW THE ABOVE TABLE WAS DEVELOPED:

1. Since the value of Te/Ts for R# 01 is 0.48 (from Column B01, Rows 70-72 of TABLE I), R# 01 is listed in Column C48, Rows 4-5 of the above Table. Likewise, since the value of Te/Ts for R# 02 is 0.98, R# 02 is listed in Column 98 of the above Table. This process is repeated until all 50 Record numbers are listed.

2. Rows 1-17 show that only 19 of the 100 Slots have one or more Record numbers which can be used. Starting with Slot 03, Record numbers 23, 29, and 44 of TABLE II are found to agree with each other, Bin by Bin; all Bins are 0. Since the logic signals of interest are in Bins -1 and 0, only these Bins are listed in the above Table. The 0's for Slot 03 are entered in Column C03, Rows 19-20. Likewise R# 15 provides the 1 for Column C07, Row 19, and the 0 for Column C07, Row 20. This process is repeated for the remaining Slots. The asterisk in Column 24, Row 20 indicates that R# 03, 17, 24, and 45 are in disagreement as to whether Slot 24, Bin -1 should contain 0 or 1. Other asterisks in Rows 19-20 indicate a similiar disagreement.

3. The transitions (0 to 1, or 1 to 0) are estimated in Rows 22-23 by starting at Column 00, Row 19 and moving to the right. The first transition is observed to occur between Slot 3 (which contains a 0 and Slot 07 which contains a 1. The best guess is that the transition occurs half way between Slot 03 and Slot 07. Since there are three slots between Slot 03 and Slot 07, there is a question as to whether the fill-in should be 011 or 001. To be consistent, this type of conflict is resolved by moving the best guess transition 1/2 slot to the right if necessary. The Row 22 fill-in between Slot 03 and Slot 07 is therefore 001. The next transition in Row 19 is between Slot 17 and Slot 24, so 111000 is the fill in for Row 22 between Slot 17 and Slot 24. Asterisks are ignored when making transition fill-ins. The transition fill-ins for the remainder of Row 22 and all of Row 23 are done in a similiar manner.

4. The completed fill-in of Rows 25 and 26 is obtained by copying Rows 22-23, Columns C0-C99, to Rows 25-26, then placing 0's in empty slots between slots containing 0's and 1's in empty slots between slots containing 1's. Since Bin -2 precedes Bin -1, and Slot 99 of Bin -2 is a 0, and Slot 03 of Bin -1 is also a 0, 0's are placed in Slots 00-02 of Bin -1. Likewise, since Slot 98 of Bin -1 and Slot 03 of Bin 0 are both 0's, 0's are placed in Slot 99 of Bin -1 and Slots 00-02 of Bin 0. Finally, since Slot 98 of Bin 0 and Slot 00 of Bin 2 both contain 0's, a 0 is placed in Slot 99 of Bin -1.

5. Row 28, Actual Bin 0, is created by using the values listed in TABLE I, Columns A & B, Rows 34-37. Since Channel B goes positive at 0.795 and negative at 0.915, 1's are placed in Row 28, Slots 80-91. The rest of Row 28 is completed in a similiar manner. Likewise, Row 31 is created by using vales from TABLE I, Columns A & B, Rows 40-43.

6. Row 29 is a duplicate of Row 25, and Row 32 is a duplicate of Row 26. Comparing Row 29 to Row 28 shows that the transitions of the reconstructed Bin 0 are accurate to within +/- 2 slots. Comparing Row 32 to Row 31 shows that the transitions of the reconstructed Bin -1 are also accurate to within +/- 2 slots.

It is claimed:

1. A logic analyzer, comprising:

means for asynchronously acquiring a plurality of sets of digital samples of at least one logic signal having edges defined by a transition from one state to another state, said acquiring means including means for maintaining a uniform period between the samples, means plurality of the resulting sets of digital samples from said acquiring means for determining a number of 1's and 0's contained in at least some of said plurality of sample sets in each of a plurality of time intervals that are fixed with respect to said signal and which have a uniform duration equal to said sample period, means responsive to said determining means for locating an edge of said at least one logical signal, in each interval having a plurality of both 1's and 0's, at a position within such interval that is proportional to the relative numbers of 1's and 0's therein, and means responsive to said edge locating means for reconstructing and displaying said logic signal.

2. The logic analyzer of claim 1 wherein said edge locating means is also responsive to values of samples in an interval immediately adjacent to the interval in which the signal edge is being located.

3. A method of sampling an electronic logic signal having edges defined by a transition from one state to another state and processing samples, comprising the following steps performed in an electronic equipment:

periodically acquiring a first set of a plurality of digital samples of said logic signal, periodically acquiring a second set of a plurality of digital samples of said logic signal, said second set having a sampling period the same as that of the first set, periodically acquiring additional sets of a plurality of digital samples of said logic signal, the period of each of said additional sets being the same as that of the first set, and all of the first, second and additional sets being acquired asynchronously from each other, determining the number of 1's and 0's of each of the first, second and additional sets of samples that occur in each of a plurality of time intervals that are fixed with respect to said signal and which have a duration equal to said sample period, designating the signal to have a uniform value throughout all intervals wherein said samples are substantially all 1's or 0's.

identifying other intervals having a plurality of both 1's and 0's, and determining for such other intervals the position of an edge of the signal to exist within said intervals a distance from an extremity thereof that is proportional to the relative number of 1's and 0's obtained by the samples acquired in such other interval, whereby the location of an edge of the sampled logic signal is obtained within a resolution that is higher than that possible with a single set of digital samples alone.

4. A method of sampling and reconstructing a repetitive electronic logic signal having a plurality of transitions between states, comprising the following steps performed in an electronic equipment, establishing a stable sampling rate which is asynchronous to the repetition rate of a logic signal to be analyzed, and sufficiently high that, during a recording period of interest, at least two consecutive of said logic signal transitions will be separated by at least two sampling periods, and all other consecutive said logic signal transitions will be separated by at least one sampling period, acquiring a first set of a plurality of digital samples of said logic signal, each of said digital samples resulting in a stored bit being a "1" or a "0" depending on the logic level at the sampling instant, acquiring a second set of a plurality of digital samples of said logic signal, the period of said second set being the same as that of the first set, acquiring additional sets of a plurality of digital samples of said logic signal, the period of each of the additional sets being the same as that of the first set, and all sets being acquired asynchronously to said logic signal and therefore asynchronously to each other, summing the number of "1" bits, or the number of "0" bits, in the first, second, and additional sets of samples that occur in each of a plurality of time intervals that are fixed with respect to said logic signal and which have a uniform duration equal to the interval between samples, using said sums to determine which said time intervals contain a logic signal transition, and the location of each logic signal transition within its said time interval with an accuracy significantly better than that possible with a single set of digital samples alone, and using said locations of logic signal transitions to reconstruct said logic signal with improved resolution and accuracy.

5. The method according to claim 4 which comprises additional steps of detecting whether any of two consecutive of said logic signal transitions are separated by at least two sampling periods, and, if not, decreasing the sample period and restarting the sampling process.

6. A logic analyzer, comprising:

means for asynchronously and simultaneously acquiring a plurality of sets of samples of at least first and second logical signals each having at least an edge defined by a transition from one state to another state, said acquiring means including means for maintaining a uniform period between the samples of each set, each of said samples indicating one of two digital states, means plurality of the resulting sets of samples from said acquiring means for determining a number of each of said two digital states of said first logical signal in a plurality of time intervals that are fixed with respect to said first logical signal and which have a uniform duration equal to said sample period, means responsive to said determining means for estimating the timing of the sets of samples relative to said time intervals, and means responsive to said acquiring means and to said determining means for reconstructing and displaying the second logical signal.

7. The logic analyzer according to claim 6 which additionally comprises means responsive to said determining means for locating an edge of the first logical signal in each interval having a substantial number of samples of both of said two digital states at a distance within such interval that is proportional to the relative numbers of samples therein that have different states.

8. A method of sampling at least first and second electronic logic signals that are phase locked to each other and each having at least an edge defined by a transition from one state to another state and reconstructing at least one of said signals, comprising the following steps carried out by an electronic instrument:

acquiring a plurality of digital records of said signals, each record containing a plurality of digital samples of said first and second logic signals taken at the same time, all records being acquired asynchronously with each other but with a uniform time period between samples, determining for the first logic signal the number of 1's and 0's of each of the records' samples that occur in each of a plurality of intervals that are fixed in time with respect to said signals, each time interval having a duration equal to said time period between samples, determining from the samples acquired from the first signal the timing of the individual records samples with respect thereto, thereby to determine the relative time positions of said intervals, and reconstructing data for the second signal from the individual samples acquired therefrom at the timing determined from the previous step, whereby any multiple edges of the second signal within the time intervals are indicated.

9. The method according to claim 8 wherein the step of determining the timing of the individual sample records includes the steps of:

determining from the samples of the first logic signal for each interval two ranges of possible timing of the sample therein, a first range if that sample is a 1 and a second range if that sample is a 0, determining the appropriate one of said first and second ranges for individual samples of said records, and selecting individually for the digital records a highest of the low end of the ranges for its samples and the lowest of a high end of the ranges, thereby to determine a range of timing of each record's samples within said intervals.

10. The method according to claim 9 wherein the step of reconstructing the second signal includes the steps of:

establishing the value of the samples of the second logic signal and their determined timing, identifying transitions between states to be located intermediate of adjacent samples of one record having different states, and filling in the same state values between said transitions.

11. The method according to claim 8 wherein the first logic signal is characterized by having only one edge in any of said intervals and said second logic signal is characterized by having more than one edge in at least one of said intervals.

12. The method according to claim 8 which comprises the additional steps of:

designating the first logic signal to have a uniform value throughout all intervals wherein its samples are substantially all 1's or 0's, identifying other intervals having a plurality of samples of the first logic signal that are both 1's and 0's, and determining for such other intervals the position of an edge of the first logic signal to exist within said intervals a distance from an extremity thereof that is proportional to the relative number of 1's and 0's obtained by the samples acquired in such other interval, whereby the location of an edge of the sampled first logic signal is obtained within a resolution that is higher than that possible with a single set of digital samples alone.

13. A method of sampling and reconstructing a plurality of repetitive, time related, electronic logic signals that each have a plurality of transitions between states, wherein one of the said logic signals is a "reference" logic signal, comprising the following steps performed in an electronic instrument, establishing a stable sampling rate which is asynchronous to the repetition rate of a plurality of time related logic signals to be analyzed, and sufficiently high that, for said "reference" logic signal of said plurality of logic signals, and during a given recording period of interest, at least two consecutive said logic signal transitions will be separated by at least two sampling periods, and all other consecutive said logic signal transitions will be separated by at least one sampling period, acquiring a first set of a plurality of digital samples of said plurality of time related logic signals, each of said digital samples resulting in a stored bit being a "1" or a "0" depending on the logic level at the sampling instant, acquiring a second set of a plurality of digital samples of said plurality of time related logic signals over a period substantially the same as that of the first set, acquiring additional sets of a plurality of digital samples of said plurality of time related logic signals, the period of each of the additional sets being the same as that of the first set, and all sets being acquired asynchronously to said plurality of time related logic signals and therefore asynchronously to each other.

summing, for said "reference" logic signal of said plurality of time related logic signals, the number of "1" bits, or the number of "0" bits, in the first, second, and additional sets of samples that occur in each of a plurality of time intervals that are fixed with respect to said plurality of time related logic signals and which have a uniform duration equal to the interval between samples, using said sums to determine, for said "reference" logic signal of said plurality of time related logic signals, which said time intervals contain a logic signal transition, and the location of each logic signal transition within its said time interval with an accuracy significantly better than that possible with a single set of digital samples alone, using said locations of the "reference" logic signal transitions in conjunction with digital samples of the "reference" logic signal stored during each acquisition of a set of digital samples of said plurality of time related logic signals to determine where the sampling instant occurred with respect to the boundaries of said time intervals for each acquisition, using said sampling instants to establish the time relationships between all of said sets of a plurality of digital samples of said plurality of time related logic signals, and using said time relationships to reconstruct any or all logic signals of said plurality of time related logic signals, with improved resolution and accuracy, including good definition of logic signals having multiple transitions within a said time interval.

* * * * *

UNITED STATES PATENT AND TRADEMARK OFFICE

CERTIFICATE OF CORRECTION

PATENT NO. : 4,777,616

DATED : Oct. 11,1988

INVENTOR(S) : Moore et al.

It is certified that error appears in the above-identified patent and that said Letters Patent is hereby corrected as shown below:

Col. 17, cl. 1, line 8: insert --receiving the-- before "plurality" and delete "the resulting";
Col. 17, cl. 1, line 12: insert --at least one logic-- before "signal";
Col. 19, line 20: replace "." with --,--;
Col. 20, line 18: insert --receiving the-- before "plurality" and delete "the resulting"; and
Col. 20, line 56: replace "records" with --records'--.

Signed and Sealed this

Eleventh Day of April, 1989

*Attest:*

DONALD J. QUIGG

*Attesting Officer*

*Commissioner of Patents and Trademarks*